(12) United States Patent
Kim et al.

(10) Patent No.: US 6,489,832 B1
(45) Date of Patent: Dec. 3, 2002

(54) CHIP INFORMATION OUTPUT CIRCUIT

(75) Inventors: Tae-hyun Kim, Seoul (KR); Kye-hyun Kyung, Sungnam (KR); Kyu-han Han, Kyungki-do (KR); Dong-hak Seen, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/672,444

(22) Filed: Sep. 29, 2000

(Under 37 CFR 1.47)

(30) Foreign Application Priority Data

Oct. 1, 1999 (KR) .......................................... 99-42332

(51) Int. Cl.[7] .............................................. H01H 85/00
(52) U.S. Cl. ...................................................... 327/525
(58) Field of Search ................................. 327/525, 526

(56) References Cited

U.S. PATENT DOCUMENTS

| | | | | | |
|---|---|---|---|---|---|
| 4,223,277 A | * | 9/1980 | Taylor et al. | .................. | 326/38 |
| 5,204,559 A | * | 4/1993 | Deyhimy et al. | ............ | 327/114 |
| 5,548,225 A | * | 8/1996 | Rountree et al. | .............. | 326/10 |
| 5,566,107 A | * | 10/1996 | Gilliam | ...................... | 327/525 |
| 5,699,003 A | * | 12/1997 | Saeki | .......................... | 327/161 |
| 5,726,585 A | * | 3/1998 | Kim | ............................. | 326/38 |
| 5,841,789 A | * | 11/1998 | McClure | ..................... | 327/276 |
| 5,907,513 A | * | 5/1999 | Kato | ............................ | 326/38 |
| 6,118,306 A | * | 9/2000 | Orton et al. | .................. | 327/44 |
| 6,166,589 A | * | 12/2000 | Park | ............................ | 327/525 |
| 6,281,739 B1 | * | 8/2001 | Matsui | ........................ | 327/525 |

\* cited by examiner

*Primary Examiner*—Terry D. Cunningham
(74) *Attorney, Agent, or Firm*—Volentine Francos, P.L.L.C.

(57) ABSTRACT

A chip information output circuit including a fuse box, capable of reducing a layout area without affecting input capacitance, is provided. The chip information output circuit includes a plurality of fuse blocks for generating different outputs according to whether a fuse is cut and a pipeline circuit for receiving a plurality of signals, which are output in parallel from the respective fuse blocks, and serially outputting the plurality of signals. Each of the fuse blocks includes a plurality of fuse boxes for generating output signals, the levels of which are either a high or low logic level according to whether the fuses included therein are cut, wherein the respective fuse boxes are enabled in response to the respective control signals and the output lines of the fuse boxes are wired by an OR operation. The pipeline circuit includes a plurality of serially connected latch units for latching signals output from the fuse blocks and outputting the latched signals.

15 Claims, 4 Drawing Sheets

CHIP INFORMATION OUTPUT CIRCUIT

The present application claims priority under 35 U.S.C. 119 to Korean Application No. 99-42332, which is hereby incorporated by reference in its entirety for all purposes.

BACKGROUND OF THE INVENTION

1. Field of the Invention

The present invention relates to a semiconductor memory device, and more particularly, to a chip information output circuit capable of increasing layout efficiency without affecting input capacitance.

2. Description of the Related Art

Manufacturing processes of semiconductor memory devices are divided into manufacturing processes of the semiconductor memory devices in wafer state and processes related to assembling the device as a package. After the manufacturing processes of the semiconductor memory devices in the wafer state are completed, it is not possible to determine information regarding individual chips. Namely, it is not possible to know where the manufactured memory device is positioned on the wafer or on which wafer the manufactured memory device is positioned in a lot.

In order to solve this problem, a fuse box including a signature transistor and a fuse is conventionally provided. FIG. 1 is a circuit diagram showing a conventional fuse box. The fuse box 1 shown in FIG. 1 is arranged in each pin of the memory device. Fuses included in each of the pins are cut in the wafer state so as to have unique information regarding the chip. After subjecting a packaged memory device to certain conditions, it is determined whether the fuse is cut for each pin by measuring current which flows through the pin. When the states of whether the fuses are cut are observed for various pins, it is possible to obtain information regarding the chip.

For example, in the fuse box 1 shown in FIG. 1, in the case where none of the first through third fuses A, B, and C are cut, when a pad apply voltage, that is, an input voltage Vin is higher than the sum of a supply voltage Vcc and a transistor threshold voltage Vtn, a first transistor T1 is turned on and a certain amount of current I flows. If only the third fuse C is cut, the current I flows only when the input voltage Vin is higher than the supply voltage Vcc+2Vtn. Also, if the second fuse B and the third fuse C are cut, the current I flows only when the input voltage Vin is higher than the supply voltage Vcc+3Vtn. When the first fuse A is cut, the current I does not flow regardless of the input voltage Vin.

The states of the input voltage Vin and the output current I are determined according to the states, cut or not cut, of the fuses. When three fuses are used, four cases exist. For example, when it is assumed that such a fuse box is included in each pin of the memory device, it is possible to store $4^N$ (N is the number of pins) information items regarding the chips.

However, because of the conventional fuse box 1 having the above structure, when the operating frequency of the memory device is greater than or equal to 400 MHZ and the memory device operates at high speed, input capacitance of each pin increases. Since signal integrity deteriorates due to the increase of the input capacitance, it is not possible to correctly receive a data signal value input to a memory device. Accordingly, the performance of the memory device may deteriorate.

Also, since the number of storable information items on the chips with respect to the number of fuses is only ½N times of the maximum number of cases, a layout area becomes larger.

SUMMARY OF THE INVENTION

The present invention is therefore directed to providing a chip information output circuit which substantially overcomes one or more of the problems due to the limitations and disadvantages of the related art.

To solve the above problems, it is an object of the present invention to provide a chip information output circuit including a fuse box capable of reducing the layout area of a chip without affecting input capacitance.

Accordingly, to achieve the above object, there is provided a chip information output circuit, comprising a plurality of fuse blocks for generating different outputs according to whether a fuse is cut and a pipeline circuit for receiving a plurality of signals, which are output in parallel from the respective fuse blocks, and serially outputting the plurality of signals.

Each of the fuse blocks comprises a plurality of fuse boxes for generating output signals, the levels of which are either a high or low logic level according to whether the fuses included therein are cut, wherein the respective fuse boxes are enabled in response to the respective control signals and the output lines of the fuse boxes are wired by an OR operation.

The pipeline circuit comprises a plurality of serially connected latch units for latching signals output from the fuse blocks and outputting the latched signals. Each of the latch units comprises a multiplexer for selecting either data input from the fuse blocks or data input from adjacent latch units and outputting the selected data and a flip-flop for synchronizing the data output from the multiplexer with a clock signal and outputting the synchronized data.

According to a first preferred embodiment, each of the fuse boxes comprises a pull-up transistor gated by a ground voltage, the pull-up transistor for outputting a signal of a logic 'high' level to the drain thereof, a pull-down transistor gated by an input signal, the pull-down transistor for outputting a signal of a logic 'low' level to the drain thereof, a fuse connected between the drain of the pull-up transistor and the drain of the pull-down transistor, and a transmission unit for transmitting a signal from the drain of the pull-up transistor to an output port in response to the input signal.

According to a second preferred embodiment, each of the fuse boxes comprises a pull-up transistor gated by an input signal, the pull-up transistor for outputting a signal of the logic 'high' level to the drain thereof, a fuse connected between a terminal to which the input signal is input and the drain of the pull-up transistor, and a transmission unit for transmitting a signal from the drain of the pull-up transistor to an output port in response to the input signal.

According to a third preferred embodiment, each of the fuse boxes comprises a pull-up transistor gated by an input signal, the pull-up transistor for outputting a signal of the logic 'high' level to the drain thereof, a pull-down transistor gated by the input signal, the pull-down transistor for outputting a signal of the logic 'low' level to the drain thereof, a fuse connected between the drain of the pull-up transistor and the drain of the pull-down transistor, a latch for latching a signal from the drain of the pull-down transistor, and a transmission unit for transmitting the output signal of the latch to an output port in response to the input signal.

According to the present invention, it is possible to obtain information on a chip by storing information in a fuse box array which generates different outputs according to whether the fuse is cut and serially reading the information through a pin. Therefore, since it is possible to store 2N information items with respect to N fuse boxes without affecting input capacitance, it is possible to reduce the layout area using a minimum number of fuses.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWING(S)

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
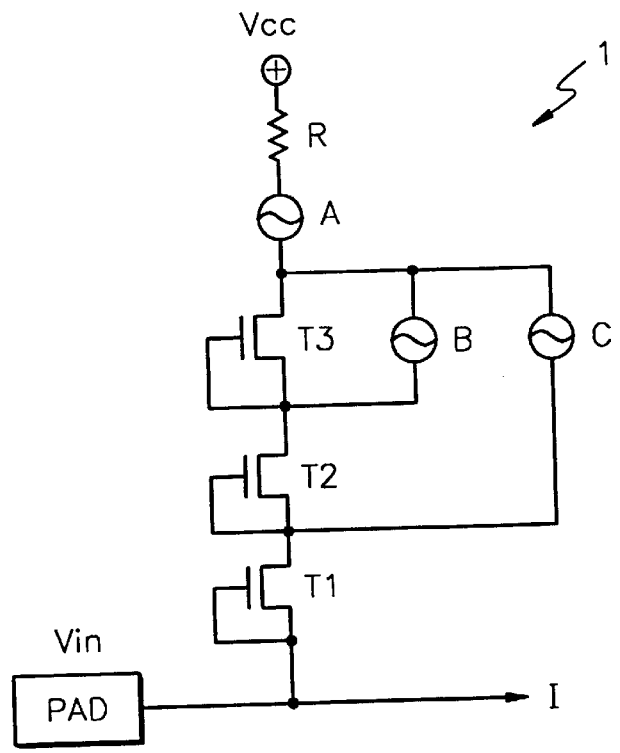
FIG. 1 is a circuit diagram showing a conventional fuse box.

The present invention now will be described more fully with reference to the accompanying drawings, in which preferred embodiments of the invention are shown. The same reference numerals in different drawings represent the same element.

Figure 2:
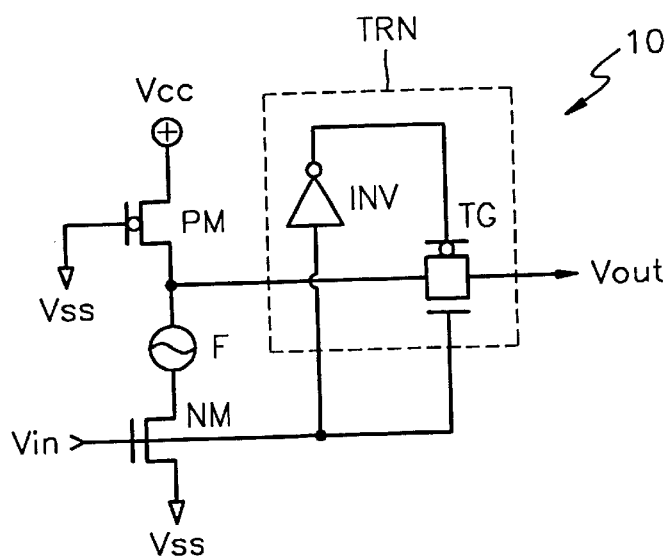
FIG. 2 is a circuit diagram showing a fuse box according to a first embodiment of the present invention.

Referring to FIG. 2, a fuse box 10 according to a first embodiment of the present invention generates an output signal Vout of a logic 'high' level in response to an input signal Vin when a fuse F is cut, and generates an output signal Vout of a logic 'low' level in response to the input signal vin when the fuse F is not cut. The fuse box 10 includes pull-up and pull-down transistors PM and NM, the fuse F, and a transmission unit TRN. The pull-up transistor PM is gated by a ground voltage Vss and outputs a signal of the logic 'high' level, that is, a supply voltage Vcc to the drain thereof. The pull-up transistor PM is always turned on and operates as a load transistor. The pull-down transistor NM is gated by the input voltage Vin and outputs a signal of the logic 'low' level, that is, the ground voltage Vss to the drain thereof. The transmission unit TRN includes an inverter INV and a transmission gate TG. The transmission unit TRN is turned on and off in response to the input signal Vin.

The operation of the fuse box 10 shown in FIG. 2 will now be described. In the case where the fuse F is not cut, when the input signal Vin of the logic 'high' level is received, the pull-down transistor NM and the pull-up transistor PM, which is gated by the ground voltage Vss, are turned on. Then, the transmission gate TG is enabled. At this time, the output signal Vout output by the pull-down transistor NM, whose current driving ability is designed to be large, through the transmission gate TG is at the logic 'low' level. To the contrary, when the input signal Vin of the logic 'high' level is received in a state that the fuse F is cut, the output signal Vout of the logic 'high' level is generated by the pull-up transistor PM.

Therefore, the level of the output signal Vout varies according to whether the fuse F is cut in the fuse box 10 shown in FIG. 2. Namely, as mentioned above, the fuse box 10 generates the output signal Vout of the logic 'high' level when the fuse F is cut and generates the output signal Vout of the logic 'low' level when the fuse F is not cut. Therefore, it is possible to store $2^N$ chip information items when it is considered that N fuse boxes are included.

Figure 3:
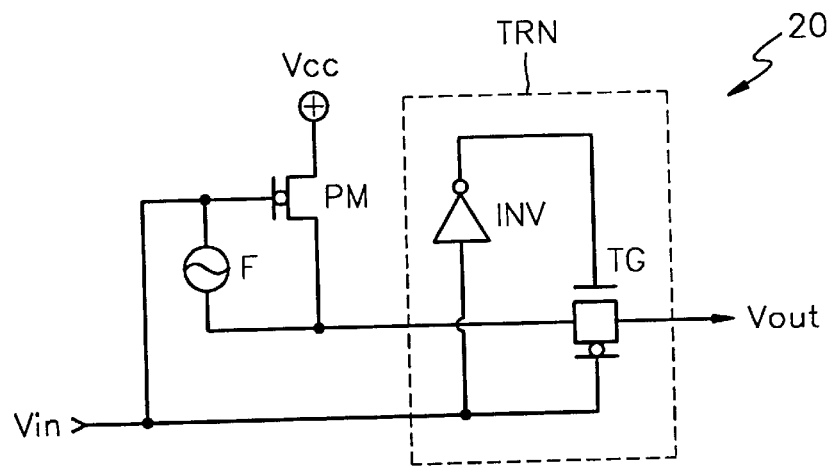
FIG. 3 is a circuit diagram showing a fuse box according to a second embodiment of the present invention.

FIG. 3 is a circuit diagram showing a fuse box 20 according to a second embodiment of the present invention. Referring to FIG. 3, the fuse box 20 generates an output signal Vout of the logic 'high' level in response to the input signal Vin when the fuse F is cut and generates the output signal Vout of the logic 'low' level when the fuse F is not cut, like the fuse box 10 according to the first embodiment of the present invention. The fuse box 20 according to the second embodiment includes the pull-up transistor PM, the fuse F, and the transmission unit TRN. The pull-up transistor PM is gated by the input voltage and outputs a signal of the logic 'high' level, that is, the supply voltage Vcc to the drain thereof. The transmission unit TRN includes the inverter INV and the transmission gate TG and is turned on and off in response to the input signal Vin.

The operation of the fuse box 20 shown in FIG. 3 will now be described. In the case where the fuse F is not cut, when the input signal Vin of the logic 'low' level is received, the transmission gate TG is enabled and the output signal Vout of the logic 'low' level is generated. To the contrary, when the input signal Vin of the logic 'low' level is received in the state that the fuse F is cut, the output signal Vout of the logic 'high' level is output by the pull-up transistor PM. Therefore, since the fuse box 20 shown in FIG. 3 generates output signals having different levels according to whether the fuse F is cut, when N fuse boxes are included, it is possible to store $2^N$ chip information items.

Figure 4:
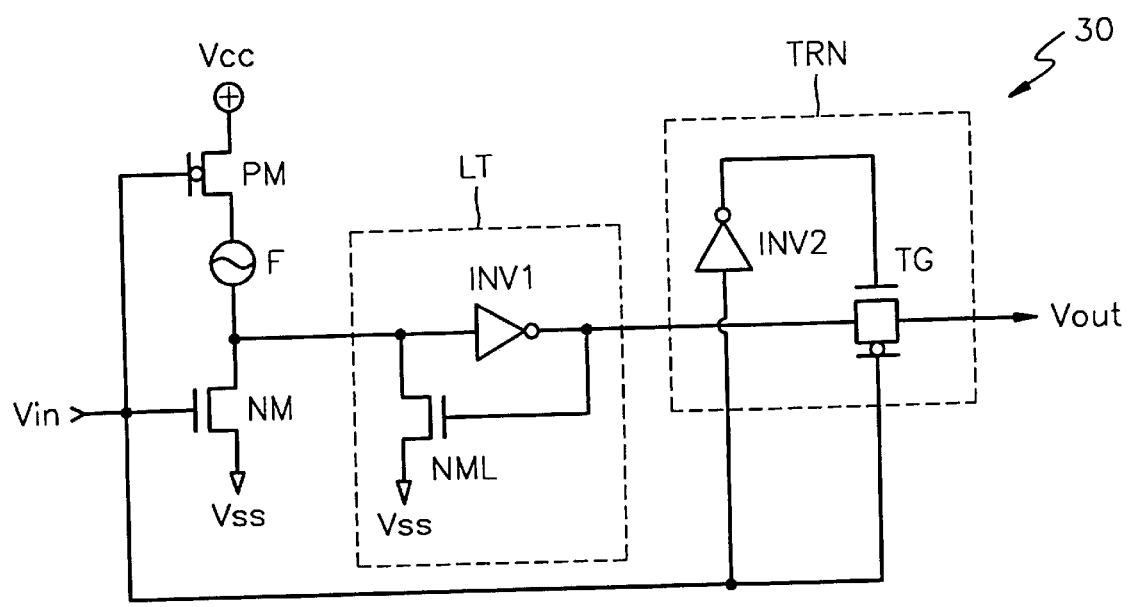
FIG. 4 is a circuit diagram showing a fuse box according to a third embodiment of the present invention.

FIG. 4 is a circuit diagram showing a fuse box 30 according to a third embodiment of the present invention. Referring to FIG. 4, the fuse box 30 generates the output signal Vout of the logic 'high' level when the fuse F is cut and generates the output signal Vout of the logic 'low' level when the fuse F is not cut, like the fuse box 20 according to the second embodiment of the present invention. The fuse box 30 according to the third embodiment of the present invention includes the pull-up transistor PM, the fuse F, the pull-down transistor NM, a latch LT, and the transmission unit TRN. The pull-up transistor PM is gated by the input voltage Vin and outputs a signal of the logic 'high' level, that is, the supply voltage Vcc to the drain thereof. Namely, the pull-up transistor PM is turned on when the input voltage Vin is at the logic 'low' level and outputs the supply voltage Vcc to the drain thereof. The pull-down transistor NM is gated by the input voltage Vin and outputs a signal of the logic 'low' level, that is, the ground voltage Vss to the drain thereof. Namely, the pull-down transistor NM is turned on when the input voltage Vin is at the logic 'high' level and outputs the ground voltage Vss to the drain thereof. The latch LT includes an inverter INV1 and a pull-down transistor NML and latches a signal from the drain of the pull-down transistor NM. The transmission unit TRN is enabled in response to the input voltage Vin and includes an inverter INV2 and the transmission gate TG.

The operation of the fuse box 30 shown in FIG. 4 will now be described. When the fuse F is not cut, the pull-up transistor PM is enabled in response to the input signal Vin of the logic 'low' level and the transmission unit TRN is enabled. Accordingly, the output signal Vout of the logic 'low' level is generated. When the fuse F is cut, the pull-down transistor NM is enabled in response to the input signal Vin of the logic 'high' level. Accordingly, the output signal of the latch LT is transited to the logic 'high' level. When the input signal Vin is transited to the logic 'low' level, the transmission unit TRN is enabled. Accordingly, the output signal Vout of the logic 'high' level is generated. Therefore, since the fuse box 30 shown in FIG. 4 generates output signals having different levels according to whether the fuse F is cut, when N fuse boxes are included, it is possible to store $_2N$ chip information items.

Figure 5:
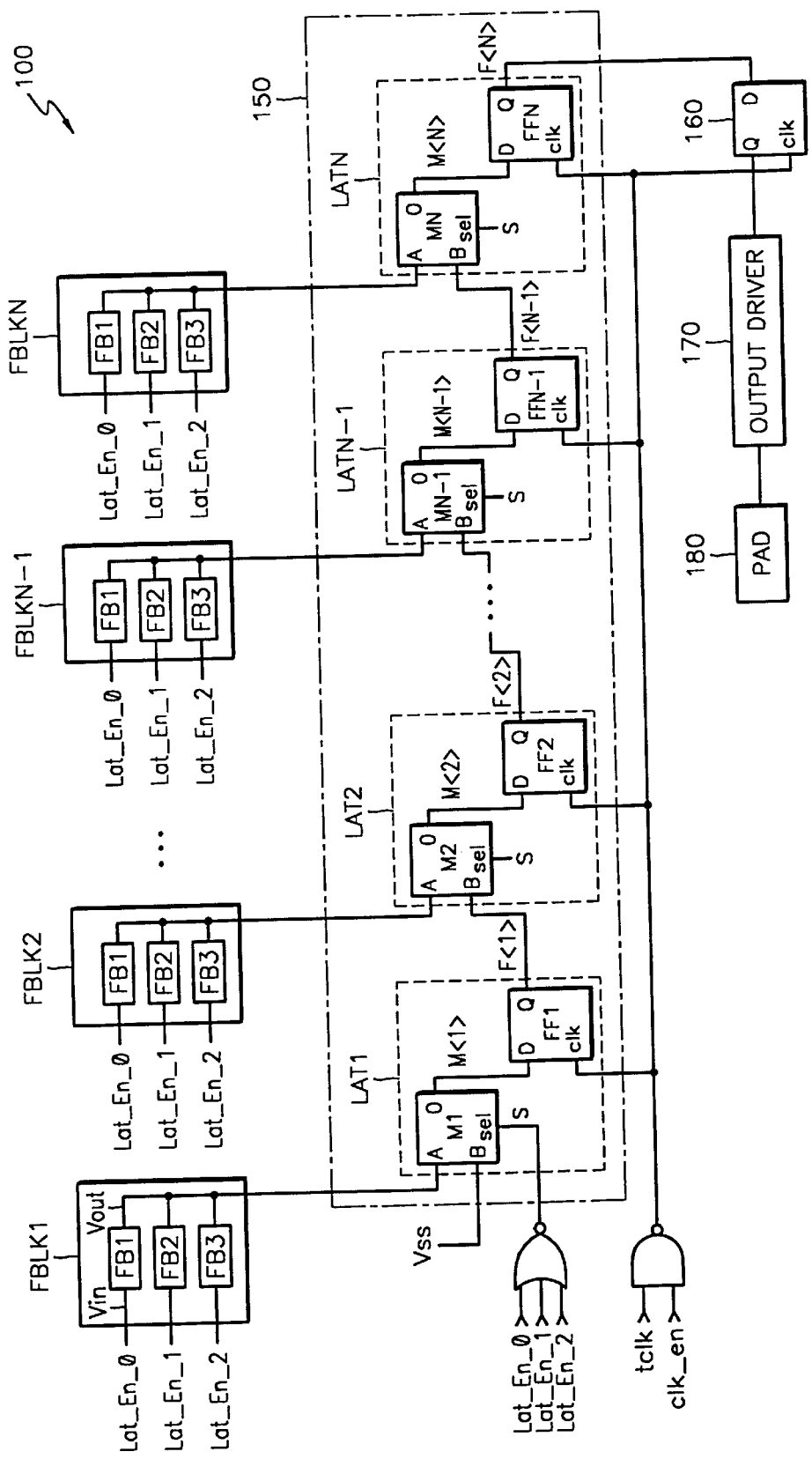
FIG. 5 is a circuit diagram showing a chip information output circuit according to the present invention.
Figure 6:
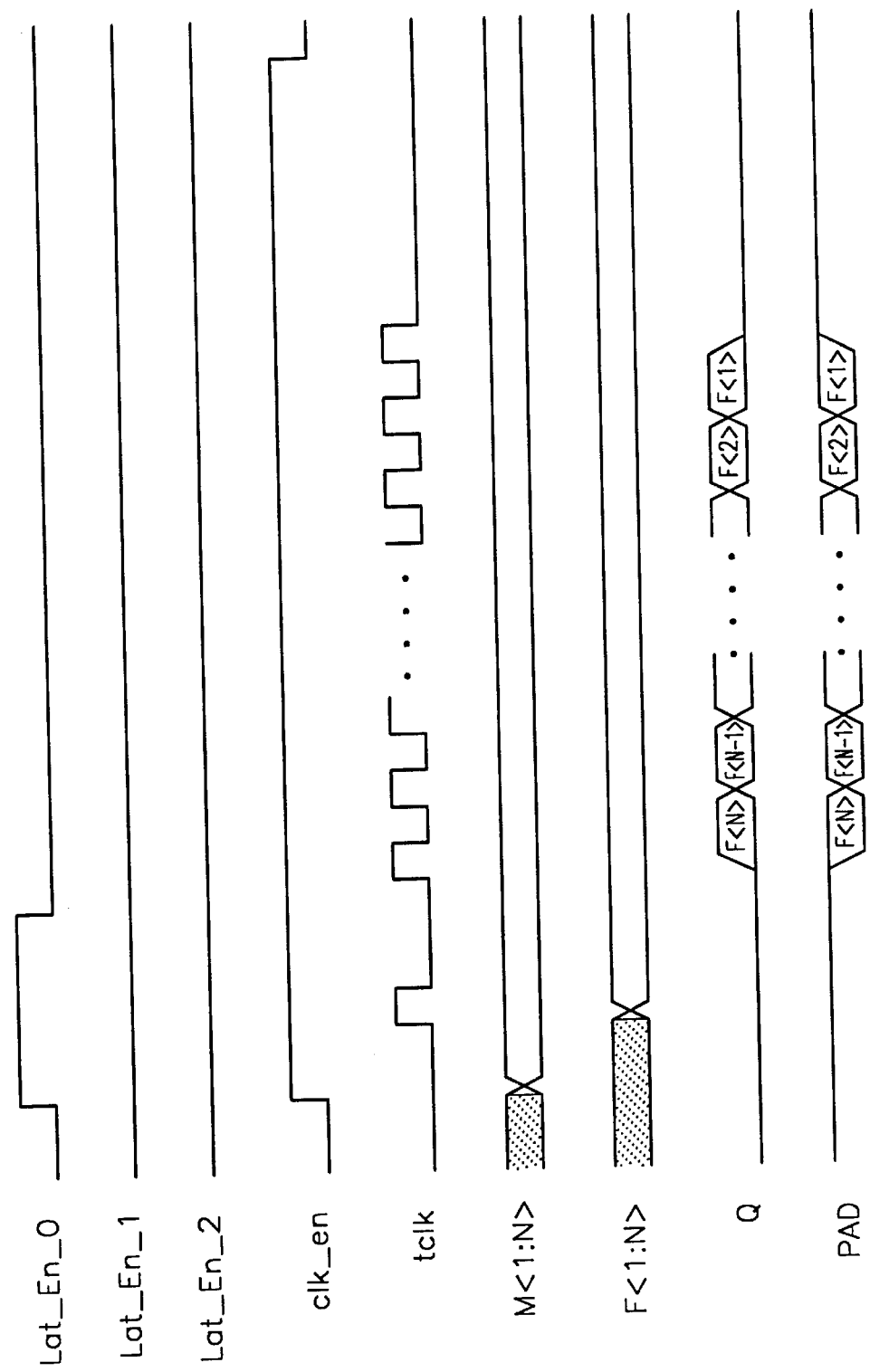
FIG. 6 is a timing diagram of the main signals used for the circuit shown in FIG. 5.

FIG. 5 is a circuit diagram showing a chip information output circuit 100 according to the present invention, which includes the fuse boxes 10, 20, and 30 shown in FIGS. 2 through 4. FIG. 6 is a timing diagram of main signals used in the circuit shown in FIG. 5.

The chip information output circuit 100 according to the present invention includes a plurality of fuse blocks FBLK1 through FBLKN, a pipeline circuit 150, a flip-flop 160, an output driver 170, and a pad 180. Information, that is, data output through the fuse blocks FBLK1 through FBLKN in parallel is serially output through the pipeline circuit 150. Data sequentially output from the pipeline circuit 150 is output through the flip-flop 160, the output driver 170, and the pad 180. To be specific, each of the plurality of fuse blocks FBLK1 through FBLKN includes a plurality of fuse boxes. In the present embodiment, three fuse boxes FB1, FB2, and FB3 are included in each fuse block. The fuse boxes FB1, FB2, and FB3 can be realized to have a form of from among the fuse boxes shown in FIGS. 2 through 4.

The fuse boxes FB1, FB2, and FB3 are enabled in response to latch enable signals Lat_En_0 through Lat_En_2 which are activated in a mode of reading data of a specific fuse block and generate the output signal Vout whose level is either a high or low logic level according to whether the fuses included therein are cut. The output lines of the fuse boxes FB1, FB2, and FB3 included in one fuse block among the fuse blocks FBLK1 through FBLKN are wired by an OR operation. Therefore, it is possible to select a desired fuse box by controlling transmission gates in the fuse boxes FB1, FB2, and FB3.

The pipeline circuit 150 receives the signals output from the fuse blocks FBLK1 through FBLKN in parallel and sequentially outputs the signals one by one. The pipeline circuit 150 preferably includes N latch units LAT1 through LATN. The data items output from the fuse blocks FBLK1 through FBLKN are input to the latch units LAT1 through LATN, respectively. The latch units LAT1 through LATN include multiplexers M1 through MN, respectively, for selecting either the data input from the fuse blocks FBLK1 through FBLKN or the data input from the latch units LAT1 through LATN and outputting the selected data, and flip-flops FF1 through FFN, respectively, for synchronizing data M<1> through M<N> output from the multiplexers M1 through MN with a clock signal clk and outputting the synchronized data as output data F<1> through F<N>.

Each of the multiplexers M1 through MN includes two input terminals A and B and one selection terminal sel. A result signal S obtained by performing a NOR operation on the latch enable signals Lat_En_0 through Lat_En_2 is input to the selection terminals sel of the multiplexers M1 through MN. The output signals of the fuse blocks FBLK1 through FBLKN are provided to input terminals A of respective multiplexers M1 through MN. The output signals F<1> through F<N–1> of the adjacent latch units LAT1 through LATN-1 are input to the input terminals B of respective multiplexers M2 through MN. The ground voltage Vss is provided to the input terminal B of multiplexer M1.

For example, when the result signal S is at the logic 'low' level, namely, when at least one of the latch enable signals Lat_En_0 through Lat_En_2 is input as the logic 'high' level, the data items of the fuse blocks FBLK1 through FBLKN are input to the flip-flops FF1 through FFN. To the contrary, when the result signal S is at the logic 'high' level, the data items stored in the adjacent latch units are input to the flip-flops FF1 through FFN. The flip-flops FF1 through FFN synchronize the output signals M<1> through M<N> of the multiplexers M1 through MN with the result signal obtained by performing a NAND operation on a test clock signal tclk and a clock enable signal clk_en and output the synchronized output signals. The flip-flops FF1 through FFN can be realized by a D-flip-flop, the next state of which is determined by an input value D. The output driver 170 transmits the output signal F<N> of the pipeline circuit 150 to the pad 180.

The operation of the chip information output circuit 100 shown in FIG. 5 will be described with reference to the timing diagram of FIG. 6. One of the latch enable signals Lat_En_0 through Lat_En_2 for selecting a specific fuse box in a fuse block and a clock enable signal clk_en are activated, in a mode of instructing the reading of data of a specific block. Here, a case where the latch enable signal Lat_En_0 is activated will be described.

The first fuse box FB1 is enabled by the activation of the latch enable signal Lat_En_0 and generates the output signal Vout having certain information regarding the chip. The generated output signal Vout is input to the pipeline circuit 150. The output signal Vout of the first fuse box FB1 is selected by the multiplexers M1 through MN and is output as the output signal M<1> through M<N>. The output signals M<1> through M<N> are input to the flip-flops FF1 through FFN. When the clock enable signal clk_en and the test clock signal tclk are transited to the logic 'high' level, the output signals M<1> through M<N> of the multiplexers M1 through MN are output by the flip-flops as output signals F<1> through F<N>.

When all the latch enable signals Lat_En_0 through Lat_En_2 are deactivated, the multiplexers M1 through MN receive the output signals F<1> through F<N> of the previous flip-flops as inputs. At this time, when the test clock signal tclk is toggled, the output of the first flip-flop FF1 is transmitted to the second flip-flop FF2, and the output of the second flip-flop FF2 is transmitted to the third flip-flop FF3, etc. The output signals Vout in the respective fuse blocks are sequentially transmitted to the output port of the Nth latch unit LATN and are output through the flip-flop unit 160, the output driver 170, and the pad 180.

According to the chip information output circuit of the present invention having the above structure, it is possible to obtain information on the chip by storing information in the fuse box array, which generates different outputs according to whether the fuses are cut, and serially reading the stored information through a pin. Also, in the conventional fuse box illustrated in FIG. 1, the input signal Vin is applied to the PAD, which is connected to the source of MOS transistor T1. Accordingly, the input capacitance at the PAD of the conventional fuse box is increased due to junction capacitance of the source of MOS transistor T1. In contrast, in the fuse boxes of the preferred embodiments of the present invention as illustrated in FIGS. 2–4, the input signal Vin is applied correspondingly to the gates of MOS transistors NM, TG, INV and PM. Accordingly, the input capacitance in the preferred embodiments is correspondingly less than in the conventional fuse box. As a result, it is possible to store $2^N$ information items in N fuse boxes in the preferred embodiments of the invention, without substantially affecting input capacitance, and it is possible to use a minimum number of fuses to thus reduce the layout area.

In the drawings and specification, there have been disclosed typical preferred embodiments of the invention and, although specific terms are employed, they are used in a generic and descriptive sense only and not for purposes of limitation, the scope of the invention being set forth in the following claims. Therefore, it will be understood by those skilled in the art that various changes in form and details may be made therein without departing from the spirit and scope of the invention as defined by the appended claims.

What is claimed is:

1. A chip information output circuit comprising:
   a plurality of fuse blocks, each including fuses therein, that generate different output signals according to whether the fuses are cut; and
   a pipeline circuit that receives the output signals in parallel from the respective fuse blocks and that serially outputs the output signals,
   wherein each of the fuse blocks comprises a plurality of fuse boxes that generate the output signals, the output signals having either a logic 'high' level or a logic 'low' level according to whether the fuses included in the fuse boxes are cut,
   the fuse boxes being respectively enabled in response to respective control signals, output lines of the fuse boxes of each fuse block being wired in an OR logic configuration, and
   wherein the pipeline circuit comprises a plurality of serially connected latch units that latch the output signals from the fuse blocks and that provide the output signals as latched signals.

2. The chip information output circuit of claim 1, wherein each of the latch units comprises:
   a multiplexer that selects either an output signal from the fuse blocks or data input from an adjacent latch unit and that outputs the selected data; and
   a flip-flop that synchronizes the selected data output from the multiplexer with a clock signal and that outputs the synchronized data as a latched signal.

3. The chip information output circuit of claim 1, wherein each of the fuse boxes comprises:
   a pull-up transistor that is gated by a ground voltage and that includes a first drain, the pull-up transistor outputs a signal of the logic 'high' level via the first drain responsive to the ground voltage;
   a pull-down transistor that is gated by an input signal and that includes a second drain, the pull-down transistor outputs a signal of the logic 'low' level via the second drain responsive to the input signal;
   a fuse connected between the first drain of the pull-up transistor and the second drain of the pull-down transistor; and
   a transmission unit that transmits a signal from the first drain of the pull-up transistor to an output port as an output signal, in response to the input signal.

4. The chip information output circuit of claim 1, wherein each of the fuse boxes comprises:
   a pull-up transistor that is gated by an input signal and that includes a drain, the pull-up transistor outputs a signal of the logic 'high' level via the drain responsive to the input signal;
   a fuse connected between a terminal to which the input signal is input and the drain of the pull-up transistor; and
   a transmission unit that transmits a signal from the drain of the pull-up transistor to an output port as an output signal, in response to the input signal.

5. The chip information output circuit of claim 1, wherein each of the fuse boxes comprises:
   a pull-up transistor that is gated by an input signal and that includes a first drain, the pull-up transistor outputs a signal of the logic 'high' level via the first drain responsive to the input signal;
   a pull-down transistor that is gated by the input signal and that includes a second drain, the pull-down transistor outputs a signal of the logic 'low' level via the second drain responsive to the input signal;
   a fuse connected between the first drain of the pull-up transistor and the second drain of the pull-down transistor;
   a latch that latches a signal from the second drain of the pull-down transistor; and
   a transmission unit that transmits a latched signal from the latch to an output port as an output signal, in response to the input signal.

6. The chip information output circuit of claim 2, wherein the fuse blocks are activated responsive to enable signals, and the multiplexers of the latch units select the output signals from the fuse blocks or the data input from adjacent latch units based on the enable signals.

7. The chip information output circuit of claim 6, wherein the enable signals are input to a logic NOR element that provides a logic NOR output as a selection signal to the multiplexers.

8. A chip information output circuit comprising:
   a plurality of fuse blocks that each include fuse boxes, the fuse boxes include respective fuses and are controlled by enable signals to provide output signals according to whether the fuses are cut; and
   a pipeline that receives the output signals from the fuse boxes and that provides the output signals serially as chip information based on the enable signals,
   wherein the pipeline comprises
   a plurality of latches, coupled together in series and coupled to receive respective output signals from the fuse blocks, that latch respective signals input thereto,
   the latches selectively latch and provide the respective output signals input thereto from the fuse blocks or respective latched signals output from adjacent latches based on the enable signals, to provide the chip information.

9. The chip information output circuit of claim 8, further comprising a selection signal generator that performs a logical operation on the enable signals to provide a selection signal,
   the latches selectively provide the output signals or the latched signals therefrom in accordance with the selection signal.

10. The chip information output circuit of claim 9, wherein the logical operation is a logical NOR operation.

11. The chip information output circuit of claim 8, wherein the latches each comprise:
- a multiplexer that selects and outputs either the respective output signal or the respective latch signal input to the latch based on the enable signals; and
- a synchronizer that synchronizes the selected output from the multiplexer with a clock signal and that provides the synchronized output as a latched signal.

12. The chip information output circuit of claim 11, wherein the synchronizer is a flip-flop.

13. The chip information output circuit of claim 8, wherein each of the fuse boxes comprises:
- a pull-up transistor that is gated by a ground voltage and that includes a first drain, the pull-up transistor outputs a signal of a logic 'high' level via the first drain responsive to the ground voltage;
- a pull-down transistor that is gated by an enable signal and that includes a second drain, the pull-down transistor outputs a signal of a logic 'low' level via the second drain responsive to the enable signal;
- a fuse connected between the first drain of the pull-up transistor and the second drain of the pull-down transistor; and
- a transmission unit that transmits a signal from the first drain of the pull-up transistor to an output port as an output signal, in response to the enable signal.

14. The chip information output circuit of claim 8, wherein each of the fuse boxes comprises:
- a pull-up transistor that is gated by an enable signal and that includes a drain, the pull-up transistor outputs a signal of a logic 'high' level via the drain responsive to the enable signal;
- a fuse connected between a terminal to which the enable signal is input and the drain of the pull-up transistor; and
- a transmission unit that transmits a signal from the drain of the pull-up transistor to an output port as an output signal, in response to the enable signal.

15. The chip information output circuit of claim 8, wherein each of the fuse boxes comprises:
- a pull-up transistor that is gated by an enable signal and that includes a first drain, the pull-up transistor outputs a signal of a logic 'high' level via the first drain responsive to the enable signal;
- a pull-down transistor that is gated by the enable signal and that includes a second drain, the pull-down transistor outputs a signal of a logic 'low' level via the second drain responsive to the enable signal;
- a fuse connected between the first drain of the pull-up transistor and the second drain of the pull-down transistor;
- a latch that latches a signal from the second drain of the pull-down transistor; and
- a transmission unit for that transmits a latched signal from the latch to an output port as an output signal, in response to the enable signal.

* * * * *